United States Patent
Zhang et al.

(10) Patent No.: US 10,212,811 B1
(45) Date of Patent: Feb. 19, 2019

(54) FLEXIBLE DISPLAY PANEL AND DISPLAY APPARATUS

(71) Applicant: Shanghai Tianma AM-OLED Co., Ltd., Shanghai (CN)

(72) Inventors: Peng Zhang, Shanghai (CN); Zhenying Li, Shanghai (CN)

(73) Assignee: SHANGHAI TIANMA AM-OLED CO., LTD. (CN)

( * ) Notice: Subject to any disclaimer, the term of this patent is extended or adjusted under 35 U.S.C. 154(b) by 0 days.

(21) Appl. No.: 15/957,010

(22) Filed: Apr. 19, 2018

(30) Foreign Application Priority Data

Sep. 11, 2017 (CN) .......................... 2017 1 0814832

(51) Int. Cl.
*H05K 1/02* (2006.01)

(52) U.S. Cl.
CPC .................................. *H05K 1/028* (2013.01)

(58) Field of Classification Search
CPC .............................. H05K 1/028; H05K 1/147
USPC ......................................... 174/254; 361/749
See application file for complete search history.

(56) References Cited

U.S. PATENT DOCUMENTS

| 2008/0055831 A1* | 3/2008 | Satoh ................ G02F 1/133305 361/600 |
| 2016/0014883 A1* | 1/2016 | Cho .......................... G09F 9/30 361/749 |

* cited by examiner

*Primary Examiner* — Sherman Ng
(74) *Attorney, Agent, or Firm* — Tarolli, Sundheim, Covell & Tummino LLP

(57) ABSTRACT

A flexible display panel and a display apparatus, the flexible display panel includes: flexible base layer; display part; packaging layer; supporting layer, including first area, bending area and second area, first area being connected with the second area via the bending area, bending area including at least two supporting teeth; supporting body located at a side of flexible base layer facing away from display device; when bending area is in flattening state, reserved space is formed between adjacent supporting teeth; when bending area is in bending state, flexible base layer, first area, supporting body, and second area are stacked in direction perpendicular to first area, adjacent supporting teeth contact with each other to provide supporting force to flexible base layer, supporting teeth together with first and second area form avoiding space, in direction perpendicular to the first area, projection of avoiding space is within projection of bending area.

21 Claims, 10 Drawing Sheets

FLEXIBLE DISPLAY PANEL AND DISPLAY APPARATUS

CROSS-REFERENCE TO RELATED APPLICATIONS

The present application claims priority to Chinese Patent Application No. 201710814832.0, filed on Sep. 11, 2017, the content of which is incorporated herein by reference in its entirety.

TECHNICAL FIELD

The present disclosure relates to the technical field of electronic devices and, in particular, to a flexible display panel and a display apparatus.

BACKGROUND

With the continuous development of display technology, flexible display technology has received more and more attention, so higher requirements have been put forward on the display performance of the flexible display panel.

A conventional flexible display panel may include a flexible base layer, a supporting body and a supporting layer. The flexible base layer may be bent, and the bending portion is supported by the supporting body.

However, since the supporting body has assembly errors with respect to the supporting layer, the supporting body is easily offset from the supporting layer, so that a portion of the supporting portion does not contact with the bending portion of the flexible base layer, resulting in that the bending portion of the flexible base layer cannot be reliably supported. Therefore, such a structure may cause the bending portion of the flexible base layer to be dangled, resulting in unsatisfactory supporting effect with respect to the flexible base layer.

SUMMARY

The present disclosure provides a flexible display panel and a display apparatus, so as to improve the supporting effect with respect to the flexible base layer.

The flexible display panel provided by the present disclosure includes: a flexible base layer; a display device disposed on the flexible base layer; a packaging layer which packages the display device, the display device being located between the flexible base layer and the packaging layer; a supporting layer disposed at a side of the flexible base layer facing away from the display device, the supporting layer including a first area, a bending area and a second area, the first area being connected with the second area via the bending area, and the bending area including at least two supporting teeth; and a supporting body disposed in the first area or in the second area, the supporting body being located at the side of the flexible base layer facing away from the display device. When the bending area is in a flattening state, reserved space is formed between any adjacent two supporting teeth of the at least two supporting teeth. When the bending area is in a bending state, the flexible base layer, the first area, the supporting body, and the second area are sequentially stacked in a direction perpendicular to the first area, any adjacent two supporting teeth of the at least two supporting teeth contact with each other so as to provide a supporting force to the flexible base layer. The at least two supporting teeth together with the first area and the second area form an avoiding space. In a direction perpendicular to the first area, a projection of the avoiding space is within a projection of the bending area.

The present disclosure further provides a display apparatus, including the above-mentioned flexible display panel.

With the flexible display panel described above, when the supporting layer is in the bending state, the supporting teeth contact with each other, thereby providing a supporting force to the bending portion of the flexible base layer, meanwhile, since the supporting teeth together with the first area and the second area form avoiding space, even if the supporting body has an assembly error with respect to the first area and the second area, causing that the supporting body may be misaligned with respect to the first area and the second area, the avoiding space can accommodate the misaligned portion of the supporting body, which makes the supporting teeth not to be easily blocked by the supporting body, so as to achieve that each supporting tooth can more reliably support the flexible base layer.

It should be understood that, both the above general description and the following detailed description are exemplary only, which will not limit the present disclosure.

REFERENCE SIGNS

Figure 1:
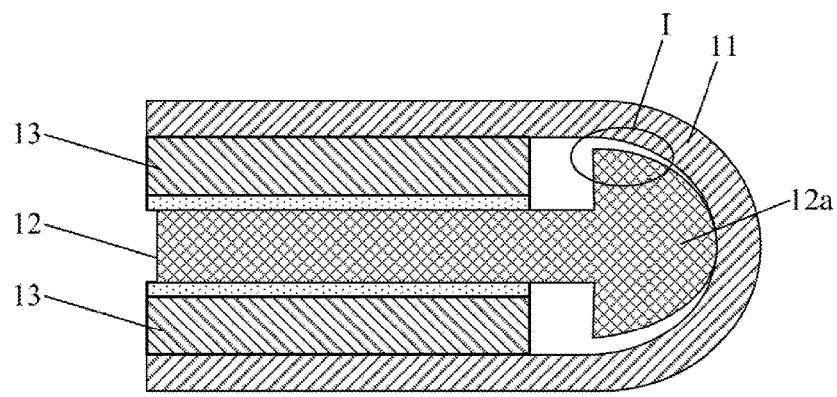
FIG. 1 is a schematic diagram of a partial structure of a conventional flexible display panel in a bending state.

Shown in FIG. 1:
11-flexible base layer;
12-supporting body;
  12a-end portion;
13-supporting layer.
Shown in FIGS. 2-19:
100-flexible display panel;
  110-flexible base layer;
  120-display device;
  130-packaging layer;
  140-supporting layer;
    141-first area;
    142-bending area;
      142a-supporting tooth;
        142aa-first supporting tooth;
        142ab-second supporting tooth;
        142ac-intermediate supporting tooth;
        142ad-first lateral surface;
        142a1-first surface;
        142ah-second surface;
        142ae-second lateral surface;
        142ai-third surface;
        142aj-fouth surface;
        142af-top surface;
        142ag-connection surface;
  143-second area;
  144a-first adhesive layer;
  144b-second adhesive layer;
  145-connection layer;
  150-supporting body;
  160-polarizing layer;
  170-touch layer;
  180-cover layer;
190-control chip;
210-first leading wire;
220-protection layer.

The drawings herein are incorporated into and constitute a part of the present specification, which show exemplary embodiments in accordance with the present disclosure and explain principles of the present disclosure together with the description.

DESCRIPTION OF EMBODIMENTS

In order to make the above purpose, features and advantages of the present disclosure clearer and more understandable, the present disclosure will be further described with reference to the accompanying drawings and embodiments. However, exemplary embodiments may be carried out in many manners and should not be construed as being limited within the embodiments herein; rather, these embodiments are provided so that the disclosure will be more comprehensive and complete, and will fully transfer the concepts of the exemplary embodiments to those skilled in the art. The same reference signs in the drawings represent the same or similar structures, and a repetitive description thereof will be omitted. The expressions of the positions and the directions in the present disclosure are all described by taking the drawings as examples, however, changes may be made if necessary, and all the changes are within the protection scope of the present disclosure. The drawings of the present disclosure are merely for illustrating the relative position relationship, the layer thicknesses of some portions are presented in an exaggeration drawing manner for the sake of comprehension, and the layer thicknesses in the drawings do not represent the proportional relationship of the actual layer thicknesses.

It should be noted that details are described hereinafter for fully understanding the present disclosure. However, the present disclosure can be implemented in various other manners different from those described herein, and those skilled in the art can make similar improvement without departing from the spirit of the present disclosure. Therefore, the present disclosure is not limited within the embodiments disclosed herein. The description of the specification is given as the preferred embodiments for implementing the present disclosure. However, the description is for the purpose of illustrating the general principles of the present disclosure and is not intended to limit the scope of the present disclosure. The scope of the present disclosure should be defined by the appended claims.

The present disclosure will be described in detail by specific embodiments and with reference to the accompanying drawings. The thickness and the shape of each component in the drawings do not represent the actual scale of the display apparatus, and merely intend to illustrate the present disclosure. It should be noted that, the embodiments in the present disclosure and the features in the embodiments may be combined with each other.

As shown in FIG. 1, FIG. 1 is a schematic diagram of a partial structure of a conventional flexible display panel in a bending state. The conventional flexible display panel may include a flexible base layer 11, a supporting body 12 and a supporting layer 13. The flexible base layer 11 may be bent, and the bending portion is supported by an end portion 12a of the supporting body 12, therefore, the end portion 12a of the supporting body 12 is generally designed as an arcuate structure so as to support the bending portion of the flexible base layer 11.

However, since the supporting body 12 has assembly errors with respect to the supporting layer 13, the supporting body 12 is easily offset from the supporting layer 13, so that a portion of the supporting portion 12a does not contact with the bending portion of the flexible base layer 11 (as shown in Section 1 of FIG. 1), so that the bending portion of the flexible base layer 11 cannot be reliably supported. Therefore, such a structure may cause the bending portion of the flexible base layer 11 to be dangled, resulting in unsatisfactory supporting effect with respect to the flexible base layer.

Figure 2:
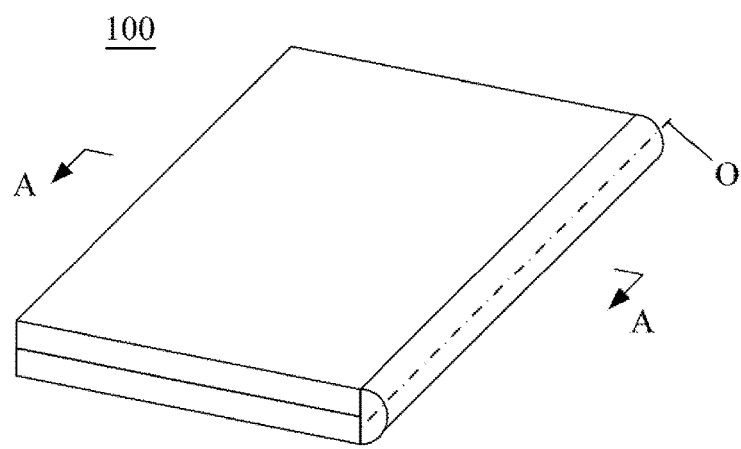
FIG. 2 is a structural schematic diagram of a flexible display panel in a bending state provided by an embodiment of the present disclosure.
Figure 3:
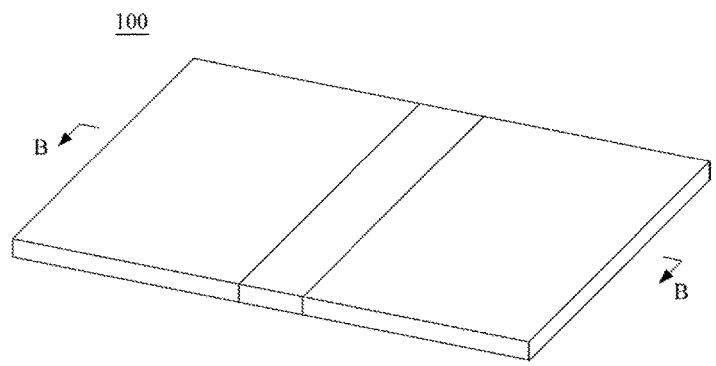
FIG. 3 is a structural schematic diagram of a flexible display panel in a flattening state provided by an embodiment of the present disclosure.
Figure 4:
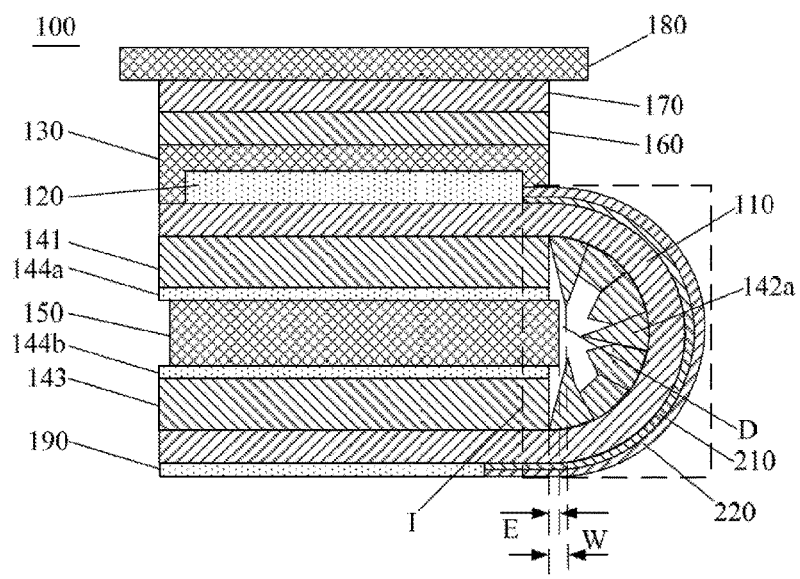
FIG. 4 is a cross-sectional view along A-A direction of the flexible display panel shown in FIG. 2.
Figure 5:
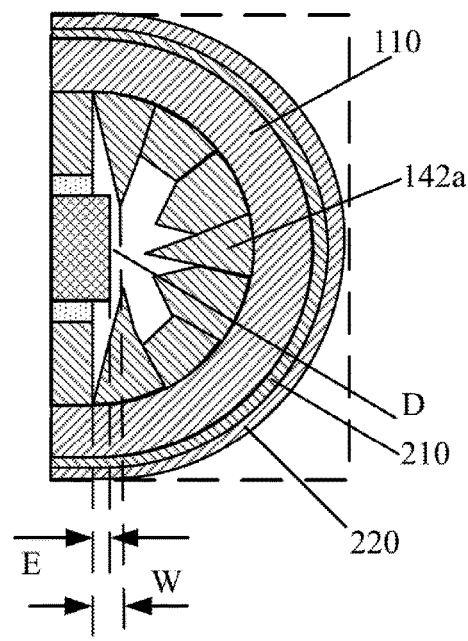
FIG. 5 is an enlarged schematic view of Section I of FIG. 4.
Figure 6:
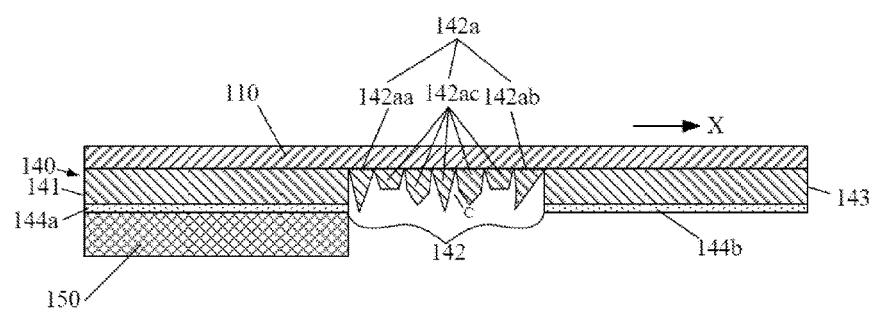
FIG. 6 is a cross-sectional view along B-B direction of the flexible display panel shown in FIG. 3.

As shown in FIG. 2 and FIG. 3, FIG. 2 is a structural schematic diagram of a flexible display panel in a bending state provided by an embodiment of the present disclosure, and FIG. 3 is a structural schematic diagram of a flexible display panel in a flattening state provided by an embodiment of the present disclosure. The flexible display panel 100 includes a bending state and a flattening state. As shown in FIGS. 4-6, FIG. 4 is a cross-sectional view along A-A direction of the flexible display panel shown in FIG. 2, FIG. 5 is an enlarged schematic view of Section I of FIG. 4, and FIG. 6 is a cross-sectional view along B-B direction of the flexible display panel shown in FIG. 3.

The flexible display panel 100 may include a flexible base layer 110, which is the basis for setting the structure of each layer of the flexible display panel 100. For example, the flexible base layer 110 may be formed of any suitable insulating material with flexibility, and the insulating material may be polymer materials such as polyimide (PI), polycarbonate (PC), polyethersulfone (PES), polyethylene terephthalate (PET), polyethylene naphthalate (PEN), polyarylate (PAR) or glass fiber reinforced plastic (FRP) and the like.

The flexible display panel 100 may further include a display device 120 disposed on the flexible base layer 110. The display device 120 may be an organic light-emitting device, and the display device 120 may include structures such as a thin film transistor, a transparent electrode, a reflective electrode, a light-emitting layer (all not shown in the drawings) and the like.

The flexible display panel 100 may further include a packaging layer 130 which packages the display device 120. The display device 120 is disposed between the flexible base layer 110 and the packaging layer 130. The packaging layer 130 can prevent moisture and other substances from entering an interior of the flexible display panel, and the packaging layer 130 can be formed by using organic layers and inorganic layers stacked on top of each other.

The flexible display panel 100 may further include a supporting layer 140 disposed at a side of the flexible base layer 110 facing away from the display device 120. The supporting layer 140 is configured to support or protect the flexible base layer 110 and may include a first area 141, a bending area 142 and a second area 143, wherein the first area 141 is connected with the second area 143 via the bending area 142. The bending area 142 includes at least two supporting teeth 142a, which may have a regular shape or an irregular shape (in the present embodiment and the drawings, it is described by taking an example that the supporting teeth 142a have an irregular shape). A material of the supporting layer 140 may be a plastic film formed by a polymer such as polyethylene-chlorinated (PEC) or polyethylene naphthalate (PEN) and the like.

The flexible display panel 100 may further include a supporting body 150 disposed in the first area 141 or in the second area 143. The supporting body 150 also functions to support or protect the flexible base layer 110, and the supporting body 150 is disposed at a side of the first area 141 or the second area 143 facing away from the flexible base layer 110; before and after the flexible base layer 110 is bent, firstly the supporting body 150 may be connected with the first area 141, and the shape of the first area 141 and its relative position to the supporting body 150 may not change. The second area 143 is connected with the supporting body 150 after the flexible base layer 110 is bent. Of course, when the flexible display panel 100 is in a flattening state, the supporting body 150 may also be connected with the second area 143. When the flexible display panel 100 is transformed from the flattening state toward the bending state, as the flexible base layer 110 is bent, the supporting body 150 moves together with the second area 143 toward a side of the first area 141 facing away from the flexible base layer 110, and then is connected with the first area 141.

In addition, as shown in FIG. 4, the above-mentioned flexible display panel 100 may further include a polarizing layer 160 disposed on the packaging layer 130, a touch layer 170 disposed on the polarizing layer 160, and a cover layer 180 disposed on the touch layer 170.

As shown in FIG. 6, when the bending area 142 is in the flattening state, reserved space C is formed between adjacent supporting teeth 142a. in the flattening state, the reserved space C is formed between opposing surfaces of the adjacent supporting teeth 142a in a direction which is parallel to the first area 141 and from the first area 141 toward the second area 143. The direction mentioned herein is: in the flattening state, a direction parallel to the first area 141, from the first area 141 toward the second area 143, and perpendicular to a bending axis of the flexible base layer 110, which may be direction X as shown in FIG. 6; that is, when the flexible base layer 110 disposed on the bending area 142 is bent toward the supporting layer 140, adjacent supporting teeth 142a may be closer to each other, allowing the flexible base layer 110 in the bending area 142 to be bent, so that a function of the reserved space C is that the supporting teeth 142a can have enough space to be bent when the flexible base layer 110 is bent.

When the flexible display panel is bent, the first area 141 or the second area 143 may be rolled around the bending area 142 with the bending area 142 being a bending axis. In this case, the bending area 142 will be deformed. As shown in FIG. 5, when the bending area 142 is in the bending state, in the non-bending area, the flexible base layer 110, the first area 141, the supporting body 150, and the second area 143 are sequentially stacked in a direction perpendicular to the first area 141; and in the bending area, adjacent supporting teeth 142a contact with each other so as to provide a supporting force to the bending flexible base layer 110. The supporting teeth 142a together with the first area 141 and the second area 143 form avoiding space D. In a direction perpendicular to the first area 141, a projection of this avoiding space D is within a projection of the bending area 142.

With the flexible display panel 100 described above, when the supporting layer 140 is in the bending state, adjacent supporting teeth 142a contact with each other, thereby providing a supporting force to the bending portion of the flexible base layer 110. Meanwhile, since the supporting teeth 142a together with the first area 141 and the second area 143 form avoiding space D, even if the supporting body 150 has an assembly error with respect to the first area 141 and the second area 143, causing that the supporting body 150 may be misaligned with respect to the first area 141 and the second area 143, the avoiding space D can accommodate the misaligned portion of the supporting body 150, so that the supporting teeth 142a cannot be easily blocked by the supporting body 150, so as to achieve that each supporting tooth 142a can more reliably support the flexible base layer 110.

Further, as shown in FIG. 4 and in combination with FIG. 6, the above-mentioned flexible display panel 100 may further include: a control chip 190, whose orthographic projection to the supporting layer 140 is located within the second area 143; a plurality of first leading wires 210, whose orthographic projection to the supporting layer 140 is located within the bending area 142; and a protection layer 220 covering first leading wire 210 so as to protect the first leading wire 210.

An orthographic projection of the display device 120 to the supporting layer 140 is located within the first area 141, and the display device 120 is electrically connected with the control chip 190 via the first leading wire 210.

With the above-mentioned structure, the control chip 190 can control the display device 120 by the first leading wire 210, so as to drive the display device 120 to work.

It should be noted that, the positions of the control chip 190, the first leading wire 210 and the protection layer 220 shown in FIG. 4 are merely used for illustration, and the three may be arranged in different positions according to different products and different requirements.

In an embodiment, as shown in FIG. 4, and in combination with FIG. 6, in the bending state, in a direction perpendicular to the first area 141, a width W of the projection of the avoiding space D is greater than or equal to an assembly error of the supporting body 150 with respect to the supporting layer 140, wherein directions in which both the width W of the projection of the avoiding space D and the assembly error of the supporting body 150 with respect to the supporting layer 140 are, are directions parallel to the first area 141, from the supporting teeth 142a toward the supporting body 150, and perpendicular to a bending axis of the bending area 142. In addition, it should be noted that, in the direction parallel to the first area 141, from the supporting teeth 142a toward the supporting body 150, and perpendicular to the bending axis of the bending area 142, when distances between different supporting teeth 142a and the supporting body 150 (this distance refers to a distance having the minimum value between each point on an outer surface of single supporting tooth 142a and the supporting body 150 in the above-mentioned direction) are not equal, the width W of the projection of the above-mentioned avoiding space D in the direction perpendicular to the first area 141, refers to the distance between the supporting tooth 142a and the supporting body 150 that is closest to the supporting body 150 in the above-mentioned direction, as shown in FIG. 4.

With the above solution, when designing the structure of the supporting teeth 142a, the design can be carried out according to the assembly error of the supporting body 150 with respect to the supporting layer 140, so that the formed avoiding space D can still accommodate the supporting body 150 when the flexible display panel 100 is in the bending state, even if the supporting body 150 reaches the maximum assembly error with respect to the supporting layer 140. Therefore, this solution can prevent the supporting teeth 142a from being blocked by the supporting body 150 in a maximum extent. Preferably, when the width W of the projection of the avoiding space D in the direction perpendicular to the first area 141 is equal to or greater than 50 μm, the assembly error of the supporting body 150 with respect to the supporting layer 140 substantially does not affect the bending of the flexible base layer 110. The reason lies in that the assembly error E of the supporting body 150 with respect to the supporting layer 140 generally does not reach 50 μm or more, so the width W of the projection of the avoiding space D in the direction perpendicular to the first area 141 is set to be greater than or equal to 50 μm, which can be substantially adaptive to the above-mentioned assembly error E generated in various situations.

Figure 7:
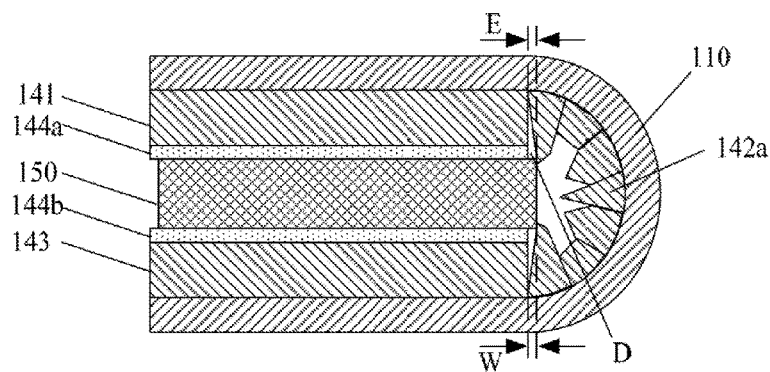
FIG. 7 is a cross-sectional view of a partial structure along A-A direction of the flexible display panel shown in FIG. 2 in another embodiment.
Figure 8:
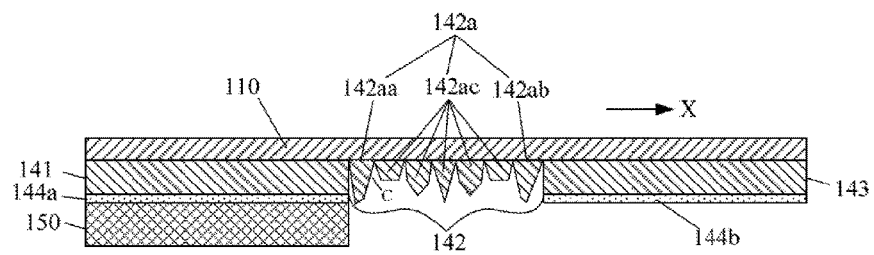
FIG. 8 is a cross-sectional view of a partial structure along B-B direction of the flexible display panel shown in FIG. 3 in another embodiment.

Each of the supporting teeth 142a includes a first supporting tooth 142aa and a second supporting tooth 142ab. As shown in FIG. 6, in the flattening state and in a direction from the first area 141 toward the second area 143, the first supporting tooth 142aa is closer to the first area 141 than other supporting tooth 142a, and the second supporting tooth 142ab is closer to the second area 143 than other supporting tooth 142a. As shown in FIG. 7 and FIG. 8, FIG. 7 is a cross-sectional view of a partial structure along A-A direction of the flexible display panel shown in FIG. 2 in another embodiment, FIG. 8 is a cross-sectional view of a partial structure along B-B direction of the flexible display panel shown in FIG. 3 in another embodiment. In combination with FIG. 6, when the flexible base layer 110 is bent, the first supporting tooth 142aa and the second supporting tooth 142ab together with the first area 141 and the second area 143 form avoiding space D, the supporting body 150 has an assembly error E with respect to the supporting layer 140, wherein the width W of the projection of the avoiding space D in the direction perpendicular to the first area 141 may be equal to the assembly error E. When the flexible base layer 110 is bent, the first supporting tooth 142aa and the second supporting tooth 142ab may contact with the supporting body 150. In such an embodiment, the shape of the bending portion can just meet the requirements when the flexible base layer 110 is bent, that is, the supporting teeth 142a are not easily blocked by the supporting body 150. The supporting body 150 can provide a supporting force to the supporting teeth 142a, so that the bending portion of the flexible base layer 110 has a higher strength.

In another embodiment, as shown in FIG. 4 and in combination with FIG. 6, in the bending state, at least one of the first supporting tooth 142aa and the second supporting tooth 142ab does not contact with the supporting body 150. That is, when the flexible base layer 110 is bent, the first supporting tooth 142aa and the second supporting tooth 142ab together with the first area 141 and the second area 143 form avoiding space D, the supporting body 150 may have an assembly error E with respect to the supporting layer 140. The width W of the projection of the avoiding space D in the direction perpendicular to the first area 141 is larger than the assembly error E.

Figure 9:
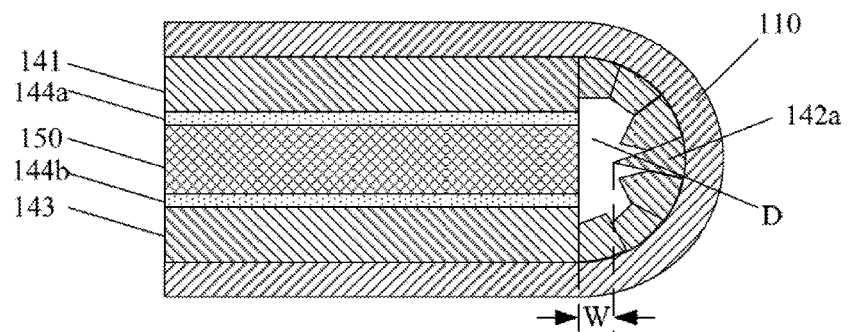
FIG. 9 is a cross-sectional view of a partial structure along A-A direction of the flexible display panel shown in FIG. 2 in still another embodiment.
Figure 10:
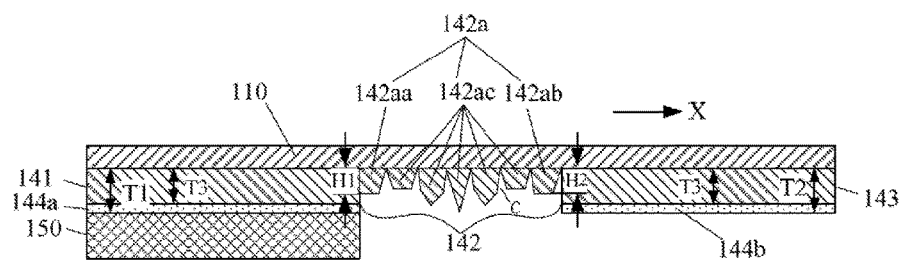
FIG. 10 is a cross-sectional view of a partial structure along B-B direction of the flexible display panel shown in FIG. 3 in still another embodiment.

In this case, an interval is formed between the supporting body 150 and at least one of the first supporting tooth 142aa and the second supporting tooth 142ab, so that at least one of the first supporting tooth 142aa and the second supporting tooth 142ab cannot contact with the supporting body 150, so that it is not easy to be blocked by the supporting body 150. Meanwhile the supporting teeth and the supporting body are prevented from colliding with each other, which may deteriorate the supporting performance and cause deformation of the product. Further, it may also be the structure shown in FIG. 9 and FIG. 10. FIG. 9 is a cross-sectional view of a partial structure along A-A direction of the flexible display panel shown in FIG. 2 in still another embodiment, and FIG. 10 is a cross-sectional view of a partial structure along B-B direction of the flexible display panel shown in FIG. 3 in still another embodiment. In combination with FIG. 6, at least one of the first supporting tooth 142aa and the second supporting tooth 142ab does not extend to the supporting body 150 in a thickness direction of the flexible display panel 100. Therefore, this structure can better achieve that the supporting tooth 142a is not easily blocked by the supporting body 150, thereby better adapting to the assembly error of the supporting body 150 with respect to the supporting layer 140.

In an embodiment, as shown in FIG. 5 and in combination with FIG. 6, the supporting layer 140 further includes an adhesive layer. In the bending state, the first area 141 and the second area 143 are respectively adhered to opposite sides of the supporting body 150 via an adhesive layer, the adhesive layer may include two parts, a first adhesive layer 144a and a second adhesive layer 144b, respectively. The first area 141 is adhered to the supporting body 150 via the first adhesive layer 144a, and the second area 143 is adhered to the supporting body 150 via the second adhesive layer 144b. In general, a thickness of the first adhesive layer 144a is equal to a thickness of the second adhesive layer 144b, and a thickness of the first area 141 is equal to a thickness of the second area 143.

In the flattening state, a height of at least one of the first supporting tooth 142aa and the second supporting tooth 142ab is less than or equal to the total thickness of the first area 141 and the adhesive layer, and the direction in which the height is located is the thickness direction of the first area 141. As shown in FIG. 10, the height H1 of the first supporting tooth 142aa is less than or equal to the total thickness T1 of the first area 141 and the first adhesive layer 144a, and the height H2 of the second supporting tooth 142ab is less than or equal to the total thickness T2 of the second area 143 and the second adhesive layer 144b.

In the above embodiment, the height of at least one of the first supporting tooth 142aa and the second supporting tooth 142ab does not exceed the total thickness of the first area 141 and the adhesive layer, so that at least one of the first supporting tooth 142aa and the second supporting tooth 142ab almost does not contact with the supporting body 150, so as to more reliably prevent the supporting teeth 142a from being blocked by the supporting body 150.

When the supporting layer 140 further includes the above-mentioned adhesive layer, further in the flattening state, the height of at least one of the first supporting tooth 142aa and the second supporting tooth 142ab is less than or equal to the thickness of the first area 141, wherein the direction in which the height is located is the thickness direction of the first area 141. As shown in FIG. 10, the height H1 of the first supporting tooth 142aa is less than or equal to the thickness T3 of the first area 141, and the height H2 of the second supporting tooth 142ab is less than or equal to the thickness T4 of the second area 143. In this case, at least one of the first supporting tooth 142aa and the second supporting tooth 142ab has a smaller height, which is less likely to contact with the supporting body 150. This solution can achieve that each supporting tooth 142a provides sufficient supporting force to the flexible base layer 110 and can also decrease the weight of the flexible display panel 100 by decreasing the height of the supporting teeth 142a.

Figure 11:
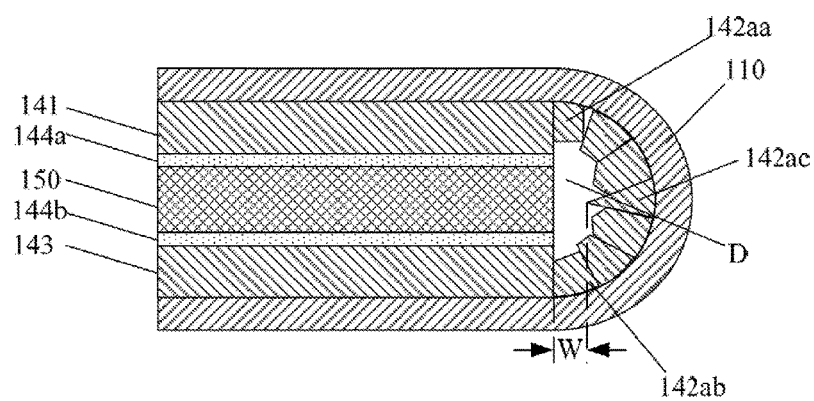
FIG. 11 is a cross-sectional view of a partial structure along A-A direction of the flexible display panel shown in FIG. 2 in still another embodiment.
Figure 12:
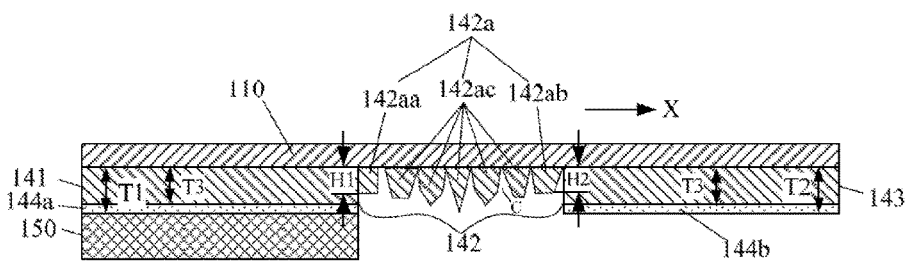
FIG. 12 is a cross-sectional view of a partial structure along B-B direction of the flexible display panel shown in FIG. 3 in still another embodiment.

In another embodiment, as shown in FIG. 11 and FIG. 12, FIG. 11 is a cross-sectional view of a partial structure along A-A direction of the flexible display panel shown in FIG. 2 in still another embodiment, and FIG. 12 is a cross-sectional view of a partial structure along B-B direction of the flexible display panel shown in FIG. 3 in still another embodiment. At least two of the supporting teeth 142a are a first supporting tooth 142aa and a second supporting tooth 142ab, respectively, and the remaining is at least one intermediate supporting tooth 142ac. In a flattening state and in the direction from first area 141 toward the second area 143, the first supporting tooth 142aa is closer to the first area 141 than other supporting teeth 142a, and the second supporting tooth 142ab is closer to the second area 143 than other supporting teeth 142a.

As shown in FIG. 12, in the flattening state, a height of the intermediate supporting tooth 142ac is larger than the height of the first supporting tooth 142aa and the height of the second supporting tooth 142ab, and the direction in which the height is located is the thickness direction of the first area 141.

It can be seen as above that, the first supporting tooth 142aa and the second supporting tooth 142ab are the supporting teeth 142a relatively closer to the supporting body 150, and both do not contact with the supporting body 150, which can prevent the supporting teeth 142a from being blocked by the supporting body 150, while the intermediate supporting tooth 142ac is more likely configured to determine the magnitude of the supporting force that the supporting teeth 142a can provide, therefore, the height of the intermediate supporting tooth 142ac is larger, so that a larger contact area between the intermediate supporting teeth 142ac can be formed, thereby providing a greater supporting force.

Figure 13:
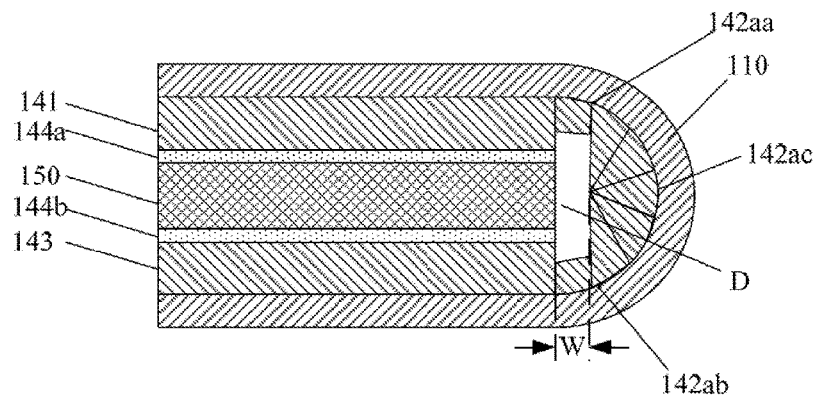
FIG. 13 is a cross-sectional view of a partial structure along A-A direction of the flexible display panel shown in FIG. 2 in still another embodiment.
Figure 15:
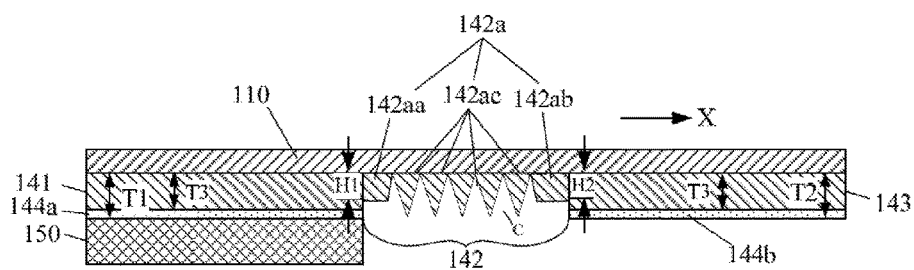
FIG. 15 is a cross-sectional view of a partial structure along B-B direction of the flexible display panel shown in FIG. 3 in still another embodiment.

More than one intermediate supporting tooth 142ac may be provided, and these intermediate supporting teeth 142ac may have the same height. As shown in FIG. 13 and FIG. 15, FIG. 13 is a cross-sectional view of a partial structure along A-A direction of the flexible display panel shown in FIG. 2 in still another embodiment, and FIG. 15 is a cross-sectional view of a partial structure along B-B direction of the flexible display panel shown in FIG. 3 in still another embodiment. Such a structure can simplify the structure of each supporting tooth 142a and then control the processing cost of the flexible display panel 100. In addition, these intermediate supporting teeth 142ac have the same height so that the sizes of all intermediate supporting teeth 142ac tend to be identical, so as to prevent some supporting teeth 142a with substantially different height from affecting the size of the finally formed avoiding space D, hereby more reliably forming the avoiding space D.

Figure 16:
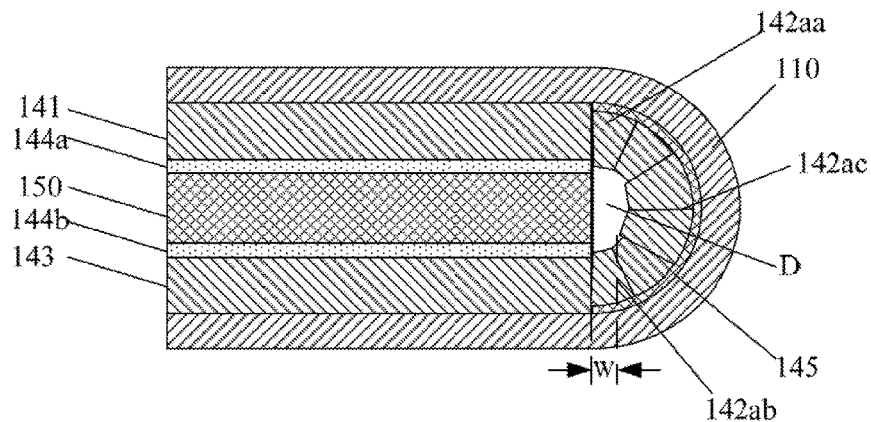
FIG. 16 is a cross-sectional view of a partial structure along A-A direction of the flexible display panel shown in FIG. 2 in still another embodiment.
Figure 17:
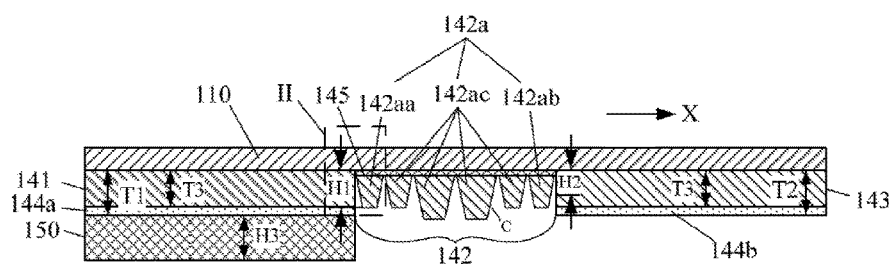
FIG. 17 is a cross-sectional view of a partial structure along B-B direction of the flexible display panel shown in FIG. 3 in still another embodiment.
Figure 18:
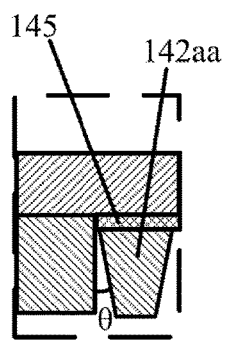
FIG. 18 is an enlarged schematic view of Section II of FIG. 17.

One or more first supporting teeth 142aa may be provided, and also one or more second supporting teeth 142ab may be provided. Optionally, as shown in FIGS. 16-18, FIG. 16 is a cross-sectional view of a partial structure along A-A direction of the flexible display panel shown in FIG. 2 in still another embodiment, FIG. 17 is a cross-sectional view of a partial structure along B-B direction of the flexible display panel shown in FIG. 3 in still another embodiment, and FIG. 18 is an enlarged schematic view of Section II of FIG. 17. There may be a plurality of first supporting teeth 142aa, and all first supporting teeth 142aa have the same height H1. The arrangement direction of the plurality of first supporting teeth 142aa may be determined based on: in the flattening state, a direction parallel to the first area 141, from the first area 141 toward the second area 143, and perpendicular to a bending axis of the flexible base layer 110, for example, direction X shown in FIG. 17. In this case, since the first supporting tooth 142aa does not easily contact with the supporting body 150 after the flexible display panel is bent, the bending reliability is improved, and the avoiding space D formed by the bending of the flexible display panel 100 is larger. Meanwhile, by setting the heights of all first supporting teeth 142aa to be identical, the processing cost of the flexible display panel 100 may be further decreased and the supporting force provided by all first supporting teeth 142aa becomes more uniform.

Similarly, as shown in FIGS. 16-17, a plurality of second supporting teeth 142ab may be provided, and all second supporting teeth 142ab have the same height H2. an arrangement direction of the plurality of second supporting teeth 142ab may be determined based on: in the flattening state, a direction parallel to the first area 141, from the first area 141 toward the second area 143, and perpendicular to a bending axis of the flexible base layer 110, for example, direction X shown in FIG. 17.

Each of the above-mentioned supporting teeth 142a may be directly connected with the flexible base layer 110, as shown in FIGS. 4-15, or may be connected with the flexible base layer 110 via other structures. In an embodiment, as shown in FIG. 16 and FIG. 17, and in combination with FIG. 6, the supporting layer 140 may further include a connection layer 145, and each supporting tooth 142a is connected with the flexible base layer 110 via the connection layer 145. Such a connection manner can enhance the connection strength between the supporting teeth 142a and the flexible base layer 110. The connection layer 145 is entire-surface connected with the flexible base layer 110 so as to prevent an individual supporting tooth 142a from connecting with the flexible base layer 110, thereby avoiding the case in which a stress concentrating area appears when bending, or a bending mark appears on the flexible base layer 110 at the interval of each supporting tooth 142a.

Further, a thickness of the above-mentioned connection layer 145 may be less than the thickness of the first area 141, so as to decrease space occupied by the connection layer 145. The space saved can be provided with the supporting teeth 142a, so that the supporting teeth 142a may have a greater height, thereby increasing the supporting force that each supporting tooth 142a can provide after contact.

Figure 19:
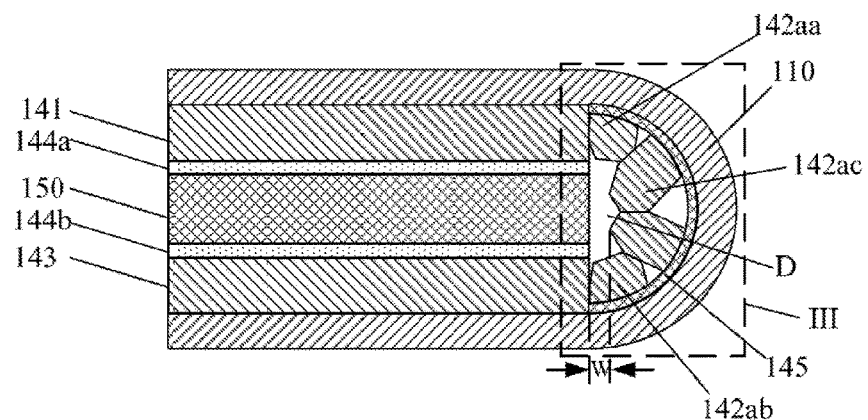
FIG. 19 is a cross-sectional view of a partial structure along A-A direction of the flexible display panel shown in FIG. 2 in still another embodiment.
Figure 20:
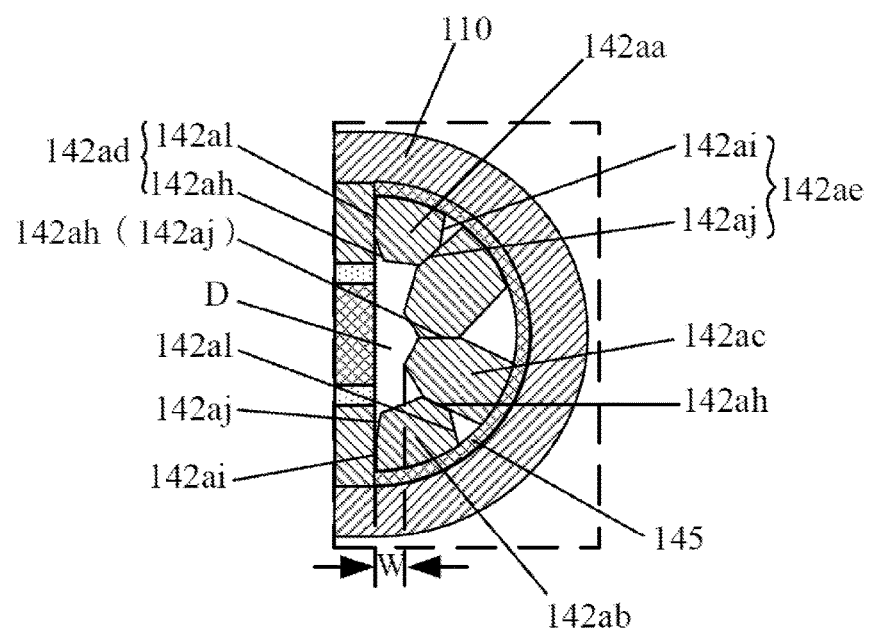
FIG. 20 is an enlarged schematic view of Section III of FIG. 19.
Figure 21:
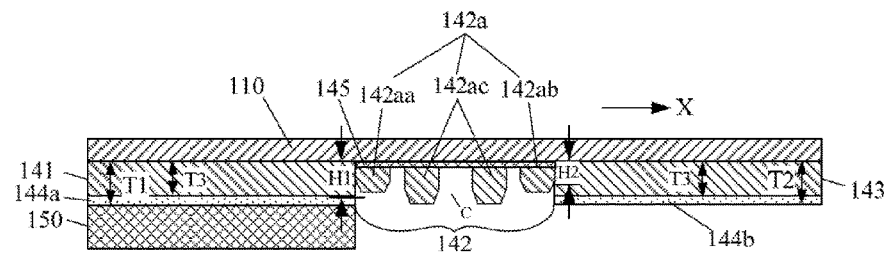
FIG. 21 is a cross-sectional view of a partial structure along B-B direction of the flexible display panel shown in FIG. 3 in still another embodiment.

One end of the supporting tooth 142a is a connection end, and the other end is a free end. The connection end is connected with the flexible base layer 110, and in a flattening state, and in the direction from the first area 141 toward the second area 143 (X direction as shown in FIG. 6), a first preset interval is formed between the free ends of two adjacent supporting teeth 142a, so as to form the above-mentioned reserved space C. In this case, as shown in FIGS. 4-18, the connection ends of adjacent supporting teeth 142a may contact with each other, so that each supporting tooth 142a can support the flexible base layer 110 in a larger area. Or as shown in FIGS. 19-21, FIG. 19 is a cross-sectional view of a partial structure along A-A direction of the flexible display panel shown in FIG. 2 in still another embodiment, FIG. 20 is an enlarged schematic view of Section III of FIG. 19, and FIG. 21 is a cross-sectional view of a partial structure along B-B direction of the flexible display panel shown in FIG. 3 in still another embodiment. A second preset interval is formed between the connection ends of adjacent supporting teeth 142a. The second preset interval can be controlled to be relatively smaller, so that adjacent supporting teeth 142a are not easily pressed against each other when the flexible base layer 110 is bent, thereby avoiding excessive local stress on the flexible base layer 110.

Figure 22:
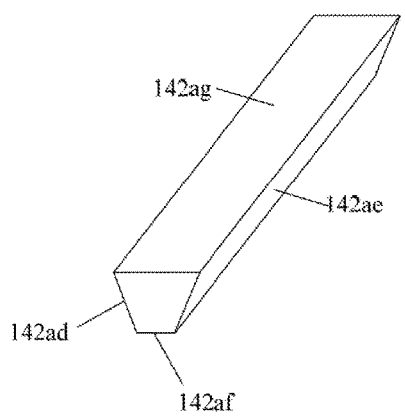
FIG. 22 is a schematic structural diagram of a supporting tooth of a flexible display panel in an embodiment.

In the embodiment of the present disclosure, as shown in FIG. 22, FIG. 22 is a schematic structural diagram of a supporting tooth 142a of a flexible display panel in an embodiment. The supporting tooth 142a includes a first lateral surface 142ad and a second lateral surface 142ae. In the flattening state, as for adjacent supporting teeth 142a, the first lateral surface 142ad of one of the adjacent supporting teeth 142a faces the second lateral surface 142ae of the other one of the adjacent supporting teeth 142a. And in the bending state, as for adjacent supporting teeth 142a, the first lateral surface 142ad of one of the adjacent supporting teeth 142a is in surface contact with the second lateral 142ae of the other one of the adjacent supporting teeth 142a. When adjacent supporting teeth 142a contact with each other in the surface contact manner, the contact area between the two is relatively larger, thereby preventing excessive deformation of the supporting teeth 142a resulting from excessive supporting force, meanwhile increasing the stability of each supporting tooth 142a supporting the flexible base layer 110.

Further, as shown in FIG. 22 and in combination with FIG. 6, the supporting tooth 142a may further include a top surface 142af and a connection surface 142ag. The first lateral surface 142ad, the top surface 142af and the second lateral surface 142ae are sequentially connected, and a non-zero included angle is formed both between the top surface 142af and the first lateral the surface 142ad and between the top surface 142af and the second lateral surface 142ae, the connection surface 142ag is used to connect with the flexible base layer 110, and the top surface 142af is opposite to the connection surface 142ag. In the flattening state, as for adjacent supporting teeth 142a, the first lateral surface 142ad of one of the adjacent supporting teeth 142a is opposite to the second lateral surface 142ae of the other one of the adjacent supporting teeth 142a. It can be understood that, if a distance between the first lateral surface 142ad and the second lateral surface 142ae is relatively large, the width of the supporting tooth 142a (the direction in which the width is located is the direction parallel to the first area 141, from the first area 141 toward the second area 143, and perpendicular to a bending axis of the flexible base layer 110) becomes relatively larger, so that the supporting tooth 142a are not easily deformed after being applied with force, which is beneficial to provide better support. In this case, if the first lateral surface 142ad is directly connected with the second lateral surface 142ae, the curvatures of the first lateral surface 142ad and the second lateral surface 142ae will not be so great that the two are substantially planar. In this case, the first lateral surface 142ad and the second lateral surface 142ae need to extend farther to be directly connected, which will inevitably result in a larger height of the supporting tooth 142a. When the supporting tooth 142a includes a first lateral surface 142ad, a second lateral surface 142ae, a top surface 142af and a connection surface 142ag, the presence of the top surface 142af is equivalent to cutting away a portion of the supporting tooth 142a with the above-mentioned connection between the first lateral surface 142ad and the second lateral surface 142ae, so that such an embodiment allows the height of the supporting tooth 142a to be appropriately decreased and further facilitates formation of larger avoiding space D. In this case, each supporting tooth 142a can provide sufficient supporting force, meanwhile after the supporting teeth 142a contact with each other, sufficiently large avoiding space D can be more reliably formed so as to better adapt to the assembly error of the supporting body 150 with respect to the supporting layer 140.

The above-mentioned top surface 142af may be a curved surface or a flat surface. As shown in FIG. 17 and FIG. 22, when the top surface 142af is a flat surface, in the flattening state, the top surface 142af may be parallel to the flexible base layer 110. In this case, the supporting teeth 142a have the same height at the first lateral surface 142ad and at the second lateral surface 142ae, so that more uniform contact area at the first lateral surface 142ad and the second lateral surface 142ae can be formed between adjacent supporting teeth 142a, ensuring that the supporting teeth 142a can provide a more balanced supporting force.

Figure 23:
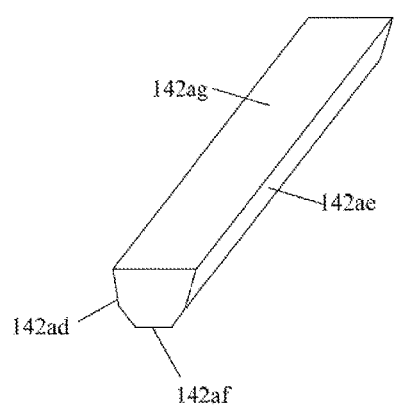
FIG. 23 is a schematic structural diagram of a supporting tooth of a flexible display panel in another embodiment.

At least one of the first lateral surface 142ad and the second lateral surface 142ae may be set as a flat surface, as shown in FIG. 22. It is also possible that both of the first lateral surface 142ad and the second lateral surface 142ae are set as curved surfaces, as shown in FIG. 23. FIG. 23 is a schematic structural diagram of a supporting tooth 142*a* of a flexible display panel in another embodiment. In an optional embodiment, at least one of the first lateral surface 142*ad* and the second lateral surface 142*ae* includes at least two sequentially connected flat surfaces disposed in different planes, and a non-zero included angle is formed between every adjacent two flat surfaces. In this case, the number and the size of the flat surface contained in the first lateral surface 142*ad* and the second lateral surface 142*ae* can be flexibly set so that contact area between adjacent supporting teeth 142*a* can meet the supporting requirement, and meanwhile larger avoiding space D can be formed. Optionally, a flat surface of the first lateral surface 142*ad* is connected with the flexible base layer 110 and may be perpendicular to the flexible base layer 110, and a flat surface of the second lateral surface 142*ae* is connected with the flexible base layer 110 and may be perpendicular to the flexible base layer 110, so that this area may have a relative larger size, thereby improving the connection strength between the supporting tooth 142*a* and the flexible base layer 110.

When the supporting teeth 142*a* include the first supporting tooth 142*aa* and the second supporting tooth 142*ab*, the supporting teeth 142*a* have the first lateral surface 142*ad* and the second lateral surface 142*ae*, the first lateral surface 142*ad* of the first supporting tooth 142*aa* is closer to the first area 141 than the second lateral surface 142*ae*, the second lateral surface 142*ae* of the second supporting tooth 142*ab* is closer to the second area 143 than the first lateral surface 142*ad*, and the first lateral surface 142*ad* of the first supporting tooth 142*aa* is fitted with the lateral surface of the first area 141, so that the first supporting tooth 142*aa* is always in contact with the first area 141, and thus the first area 141 provides the first supporting tooth 142*aa* with force, and the first area 141 supports the flexible base layer 110 via the first supporting tooth 142*aa*, reinforcing the supporting force applied on the flexible base layer 110. Of course, the second lateral surface 142*ae* of the second supporting tooth 142*ab* may also be fitted with the lateral surface of the second area 143, so that the second area 143 supports the flexible base layer 110 via the second supporting tooth 142*ab*.

In order to achieve the supporting strength of the supporting teeth 142*a*, the supporting teeth 142*a* may be formed as a rib-like structure. As shown in FIGS. 22-23, an extending direction of the supporting teeth 142*a* is parallel to the bending axis of the bending area 142, so that a relatively larger supporting area between the supporting teeth 142*a* and the flexible base layer 110 can be formed. In the extending direction of the supporting teeth 142*a*, a longitudinal cross-section of the rib-like supporting teeth 142*a* does not change, and the supporting teeth 142*a* are arranged along the direction from the first area 141 toward the second area 142. It should be noted that, the longitudinal cross-section herein is a surface perpendicular to the bending axis of the bending area 142.

In an embodiment, the longitudinal cross-sectional shape of at least one supporting tooth 142*a* is at least one of triangular (such as the intermediate supporting tooth 142*ac* shown in FIG. 15), rectangular (such as the first supporting tooth 142*aa* shown in FIG. 12), trapezoid (such as the intermediate supporting tooth 142*ac* shown in FIG. 17), pentagons, and hexagons. The longitudinal cross-section herein is a plane perpendicular to the bending axis of the bending area 142. These supporting teeth 142*a* with theses shapes have simpler structures, which facilitates processing.

In addition, at least two of the supporting teeth have different longitudinal cross-sectional shapes, so as to meet the supporting requirements at different positions. For example, some certain positions in the flexible base layer may be subjected to a relatively large force, then the longitudinal cross-section of the supporting teeth corresponding to these positions may be set to be a more resilient cross-section, and the longitudinal cross-sections of the supporting teeth corresponding to other positions can be selected flexibly. For example, as shown in FIG. 17, the first supporting tooth 142*aa* and the second supporting tooth 142*ab* have a trapezoidal longitudinal cross-section, and the intermediate supporting tooth 142*ac* has a triangular longitudinal cross-section.

The advantage of this structure lies in the following aspects. If both the longitudinal section of the first supporting tooth 142*aa* and the longitudinal section of the second supporting tooth 142*ab* are triangular shaped, in order to prevent the first supporting tooth 142*aa* and the second supporting tooth 142*ab* from being blocked by the supporting body 150, the height of the first supporting tooth 142*aa* and the second supporting tooth 142*ab* should not be too large, otherwise, it would results in that the two lateral surfaces of the first supporting tooth 142*aa* and the second supporting tooth 142*ab* together with the lateral surface of the first area 141 (specifically, the lateral surface in contact with the first supporting tooth 142*aa* in the first area 141) and the lateral surface of the intermediate supporting tooth 142*ac* form a relatively larger included angle; if the included angle is larger than the bending angle of the flexible display panel, the first supporting tooth 142*aa* and the second supporting tooth 142*ab* will not easily contact with the first area 141 and the intermediate supporting tooth 142*ac* when the flexible display panel is bent, resulting in poor supporting effect of the first supporting tooth 142*aa* and the second supporting tooth 142*ab*. On the contrary, if both the longitudinal cross-section of the first supporting tooth 142*aa* and the longitudinal cross-section of the second supporting tooth 142*ab* are trapezoidal shaped, the two are less likely to be blocked by the supporting body 150 thereby forming relatively larger avoiding space D, and in addition, the included angle formed by the lateral surfaces of the first supporting tooth 142*aa* and the second supporting tooth 142*ab* together with the lateral surface of the first area 141 and the lateral surface of the intermediate supporting tooth 142*ac* can be arbitrarily selected, so as to meet the requirement that the two are in surface contact with the first area 141 and the intermediate supporting tooth 142*ac*.

In the meantime, when the intermediate supporting tooth 142*ac* is triangular-shaped, since the first supporting tooth 142*aa* and the second supporting tooth 142*ab* have trapezoidal cross sections, the first supporting tooth 142*aa* and the second supporting tooth 142*ab* form relatively larger interval space, so the height of the intermediate supporting tooth 142*ac* can be properly increased, so that a relatively larger contact area is formed between the intermediate supporting teeth 142*ac* without affecting the size of the avoiding space D. In this case, a plurality of intermediate supporting teeth 142*ac* can form a relatively larger contact area when the flexible display panel is bent, so as to decrease intensity of pressure and make the intermediate supporting teeth 142*ac* less likely to be deformed or crushed even when being applied with force, thereby better bearing the force.

In an optional embodiment, when at least two of the supporting teeth 142*a* are the first supporting tooth 142*aa* and the second supporting tooth 142*ab* respectively, and the remaining is at least one intermediate supporting tooth 142*ac*, the above-mentioned intermediate supporting teeth 142*ac* may be divided into multiple groups, and all intermediate supporting teeth 142*ac* in each group have the same height, the intermediate supporting teeth 142*ac* in different groups may have different height. For example, as shown in FIG. 17, the longitudinal cross-sections of the first supporting tooth 142*aa*, the second supporting tooth 142*ab* and the intermediate supporting teeth 142*ac* are trapezoidal-shaped, the two intermediate supporting teeth 142*ac* located at the middle portion have the same height, the two intermediate supporting teeth 142*ac* adjacent to the two intermediate supporting teeth 142*ac* located at the middle portion have a relatively smaller height, so as to achieve that the supporting teeth 142*a* do not easily contact with the supporting body 150 and that an individual intermediate supporting tooth 142*ac* can be prevented from being excessively long, which results in a smaller width W of the projection of the avoiding space D.

Optionally, as shown in FIG. 15, at least one of the first supporting tooth 142*aa* and the second supporting tooth 142*ab* has a longitudinal cross-section with a right-angled trapezoidal shape. In this case, in order to better prevent the supporting teeth from being blocked by the supporting body 150 so as to form more sufficient avoiding space D, the height H1 of at least one of the first supporting tooth 142*aa* and the second supporting tooth 142*ab* is smaller than the thickness T3 of the first area 141.

Figure 14:
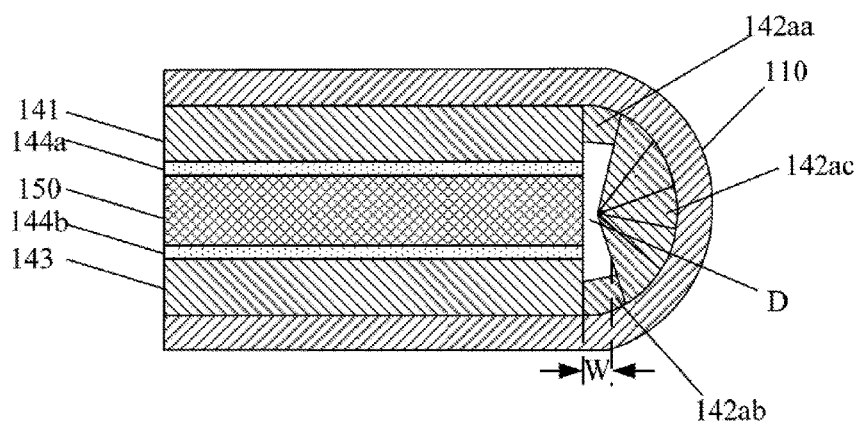
FIG. 14 is a cross-sectional view of a partial structure along A-A direction of the flexible display panel shown in FIG. 2 in still another embodiment.

Preferably, in the structure shown in FIG. 15, at least one of the first supporting tooth 142*aa* and the second supporting tooth 142*ab* has a longitudinal cross-section with a right-angled trapezoidal shape, and the right-angled edge of the right-angled trapezoidal cross-section is located at a side of the first supporting tooth 142*aa* and the second supporting the tooth 142*ab* respectively facing the first area 141 and the second area 143. Meanwhile, when the flexible display panel is in the flattening state, the right-angled edge of the right-angle trapezoid cross-section contacts with the first area 141 and the second area 143, respectively. Each intermediate supporting tooth 142*ac* has a triangular longitudinal cross-section, and all intermediate supporting teeth 142*ac* have the same height. In addition, the height of the first supporting tooth 142*aa* and the height of the second supporting tooth 142*ab* may be the same, so as to facilitate processing the flexible display panel. The height of the intermediate supporting tooth 142*ac* is greater than the height of the first supporting tooth 142*aa* and the second supporting tooth 142*ab*, so that a larger contact area can be more reliably formed between the intermediate supporting teeth 142*ac* and between the intermediate supporting tooth 142*ac* and the first supporting tooth 142*aa* and the second supporting tooth 142*ab*, thereby providing greater supporting force. In addition, as shown in FIG. 14, FIG. 14 is a cross-sectional view of a partial structure along A-A direction of the flexible display panel shown in FIG. 2 in still another embodiment. In the bending state, a pattern of the avoiding space D formed by each supporting tooth 142*a* is more regular. The longitudinal cross-sections of the first supporting tooth 142*aa* and the second supporting tooth 142*ab* are both set as trapezoidal cross-sections, so that one edge of the first supporting tooth 142*aa* and the second supporting tooth 142*ab* can respectively contact with the first area 141 and the second area 143, and the other edge can provide enough reserved space for better bending the flexible base layer 110. Meanwhile, when the flexible display panel is bent, a portion of the flexible display panel corresponding to the first supporting tooth 142*aa* and the second supporting tooth 142*ab* is substantially not bent, and only the portion of the flexible display panel corresponding to the intermediate supporting tooth 142*ac* is bent. Since the first supporting tooth 142*aa* and the second supporting tooth 142*ab* have a right-angled trapezoidal cross-section, the first supporting tooth 142*aa* and the second supporting tooth 142*ab* form relatively larger interval space, therefore the height of the intermediate supporting tooth 142*ac* having a triangular cross-section can be properly increased. Optionally, all intermediate supporting teeth have the same height. In the bending state, the state of the intermediate supporting tooth with the triangular cross-section is that, the vertices of all triangles is converged at one point, and this point corresponds to the center corresponding to the curvature radius of the bending flexible display panel corresponding to the intermediate supporting tooth. In the triangular cross-section of the intermediate supporting tooth, the height of the triangle is equivalent to the curvature radius of the bending flexible display panel corresponding to the intermediate supporting tooth. In this way, the height of the intermediate supporting tooth 142*ac* with the triangular cross-section is increased, that is, the bending curvature radius of the corresponding flexible display panel is increased, so that when a larger contact area is formed between the intermediate supporting teeth 142*ac*, a portion of the flexible base layer 110 corresponding to the intermediate supporting tooth 142*ac* has a larger bending curvature radius, thus avoiding excessive bending of the flexible display panel. Meanwhile, a width of a projection of the bending portion in the direction perpendicular to the flexible display panel is smaller, that is, the bending portion occupies smaller space, which is beneficial to the design of narrow border. The longitudinal cross-section of the intermediate supporting tooth 142*ac* is a triangular cross-section, which can simplify the process of the flexible display panel.

As shown in FIGS. 16-18, and in combination with FIG. 6 and FIG. 22, at least one of the first supporting tooth 142*aa* and the second supporting tooth 142*ab* has a longitudinal section with a non-right-angled trapezoidal shape. In this case, The structure of the first supporting tooth 142*aa* and the second supporting tooth 142*ab* may be as shown in FIG. 22, wherein at least one of the two may have a top surface 142*af*. Referring to the above description of the top surface 142*af*, it can be seen that, such a structure may achieve that the height of at least one of the first supporting tooth 142*aa* and the second supporting tooth 142*ab* can be properly decreased, thereby more easily forming larger avoiding space D. In this case, at least one of the first supporting tooth 142*aa* and the second supporting tooth 142*ab* can provide sufficient supporting force. Meanwhile, after the supporting teeth 142*a* are in contact with each other, sufficiently large avoiding space D can be more reliably formed so as to better adapt to the assembly error of the supporting body 150 with respect to the supporting layer 140.

Further, the longitudinal sections of the first supporting tooth 142*aa* and the second supporting tooth 142*ab* may both be a non-right-angled trapezoidal cross-section. As shown in FIG. 17 and FIG. 18, in the flattening state, an angle θ is formed between the first area 141 and the first supporting tooth 142*aa*, in order words, θ is an included angle between the first lateral surface 142*ad* of the first supporting tooth 142*aa* and the lateral surface in the first area 141 being in contact with the first supporting tooth 142*aa*, then the condition that H1<(T3−E*tan θ)*cos θ is satisfied so as to prevent the first supporting tooth 142*aa* from being blocked by the supporting body 150 after the flexible display panel is bent. Wherein T3 is the thickness of the first area 141, H1 is the height of the first supporting tooth 142*aa*, and E is the assembly error.

Further, in combination with the above relational expression, when θ is not less than 45 degrees, the problem of excessive bending of the flexible display panel can be prevented.

In addition, in the structure shown in FIG. 17, the first supporting tooth 142aa, the second supporting tooth 142ab, and each intermediate supporting tooth 142ac have trapezoidal longitudinal cross-sections, and the height of all intermediate supporting teeth 142ac are the same. In addition, the height of the first supporting tooth 142aa and the height of the second supporting tooth 142ab may be identical, so that the processing process of the first supporting tooth 142aa is substantially the same as the processing process of the second supporting tooth 142ab, so as to facilitate processing the flexible display panel; the height of the intermediate supporting tooth 142ac is greater than the height of the first supporting tooth 142aa and the height of the second supporting tooth 142ab, so that a larger contact area can be more reliably formed between the intermediate supporting teeth 142ac and between the intermediate supporting tooth 142ac and the first supporting tooth 142aa and the second supporting tooth 142ab, thereby providing greater supporting force. The longitudinal cross-sections of the first supporting tooth 142aa and the second supporting tooth 142ab are both set as trapezoidal cross-sections, so that one edge of the first supporting tooth 142aa and the second supporting tooth 142ab can respectively contact with the first area 141 and the second area 143, and the other edge can provide enough reserved space for better bending the flexible base layer 110. The longitudinal cross-section of the intermediate supporting tooth 142ac is a trapezoidal cross-section, which can simplify the process of the flexible display panel.

In addition, in the structure shown in FIGS. 19-21, the longitudinal cross-section of at least one of the first supporting tooth 142aa and the second supporting tooth 142ab is hexagonal. Optionally, the longitudinal cross-section of each intermediate supporting tooth 142ac may also be hexagonal, and the height of all intermediate supporting teeth 142ac may be the same. In addition, the height of the first supporting tooth 142aa may be identical to the height of the second supporting tooth 142ab, so as to facilitate processing the flexible display panel; the height of the intermediate supporting tooth 142ac is greater than the height of the first supporting tooth 142aa and the height of the second supporting tooth 142ab, so that a larger contact area can be more reliably formed between the intermediate supporting teeth 142ac and between the intermediate supporting tooth 142ac and the first supporting tooth 142aa and the second supporting tooth 142ab, the intermediate supporting tooth 142ac is less likely to be deformed or crushed when being applied with force and thus being able to bear a greater force, in other words, the intermediate supporting tooth 142ac can provide greater supporting force.

Optionally, the first supporting tooth 142aa, the second supporting tooth 142ab, and the intermediate supporting tooth 142ac are separated from each other and form a surface contact. As described above, such a structure can achieve the supporting effect, while keeping the bending curvature radius of the flexible display panel not changed, the number density of the supporting teeth 142a can be decreased, the manufacturing difficulty of the flexible display panel can be decreased, since the supporting teeth 142a are separated from each other in the flattening state, therefore, it is avoided that an individual supporting tooth 142a is abnormal during the manufacturing process, which influences the surrounding supporting tooth 142a and makes the surrounding supporting tooth 142a to be deformed. Of course, such a structure decreases the number of the supporting tooth 142a while achieving that the supporting tooth 142a can provide sufficient support, thereby saving material.

Further, with reference to FIG. 23, at least two of the supporting teeth 142a are the first supporting tooth 142aa and the second supporting tooth 142ab, and the remaining is at least one intermediate supporting tooth 142ac. In the flattening state, and in the direction from the first area toward the third area, the first supporting tooth 142aa is closer to the first area 141 than the other supporting teeth 142a, and the second supporting tooth 142ab is closer to the second area 143 than the other supporting teeth 142a. In the flattening state, the height of the intermediate supporting tooth 142ac is greater than that of the first supporting tooth 142aa and that of the second supporting tooth 142ab, and the direction in which the height is located is the thickness direction of the first area 141. The lateral surfaces of each of the first supporting tooth 142aa, the second supporting tooth 142ab, and the intermediate supporting tooth 142ac described above may include a two-part flat surface, the first lateral surface 142ad of the second supporting tooth 142ab and the intermediate supporting tooth 142ac includes a first surface 142ak and a second surface 142ah, and the second lateral surface 142ae includes a third surface 142ai and a fourth surface 142aj. The first surface 142ak is connected between the second surface 142ah and the connection surface 142ag, and the third surface 142ai is connected between the fourth surface 142aj and the connection surface 142ag. When the flexible display panel is in the bending state, the first surface 142ak of the first supporting tooth 142aa is fitted with the lateral surface of the first area 141, and the fourth surface 142aj of the first supporting tooth 142aa is in surface contact with the first surface 142ak of the intermediate supporting tooth 142ac. As for adjacent intermediate supporting teeth 142ac, the second surface 142ah of one of the adjacent intermediate supporting teeth 142ac is in surface contact with the fourth surface 142aj of the other one of the adjacent intermediate supporting teeth 142ac. The third surface 142ai of the second supporting tooth 142ab is fitted with the lateral surface of the second area 143. The second surface 142ah of the second supporting tooth 142ab is in surface contact with the third surface 142ai of the intermediate supporting tooth 142ac.

As for the above-mentioned structure, the first surface 142ak and the third surface 142ai of the first supporting tooth 142aa, the second supporting tooth 142ab, and the intermediate supporting tooth 142ac may be used to mainly control the overall height of these three parts; and the bending degree of the flexible display panel can mainly be controlled by the second surface 142ah and the fourth surface 142aj of the first supporting tooth 142aa and the second supporting tooth 142ab.

In another embodiment, in order to improve the adaptability of the supporting teeth 142a with respect to the assembly error of the supporting body 150, in the bending state, the supporting teeth 142a do not contact with the supporting body 150, so that larger space is kept between the supporting teeth 142a and the supporting body 150, so as to more reliably prevent the supporting teeth 142a from being blocked by the supporting body 150.

In combination with FIG. 6, in order to enhance the structural strength of the entire supporting layer 140, the supporting layer 140 may be designed as an integrated structure. That is, each section contained in the supporting layer 140, i.e., the first area 141, the bending area 142, the second area 143, and the connection layer 145 are formed by one-time molding without assembly, and a high bonding strength is formed between each section, thereby achieving higher structural strength.

Figure 24:
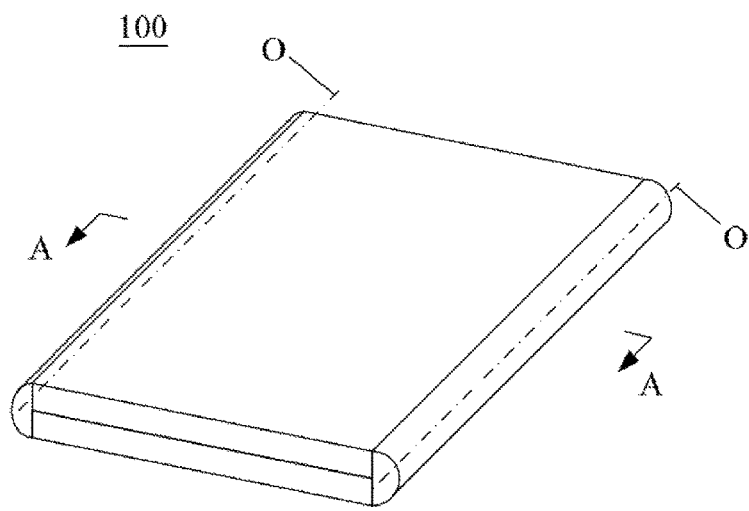
FIG. 24 is a schematic structural diagram of a flexible display panel in a bending state in still another embodiment.
Figure 25:
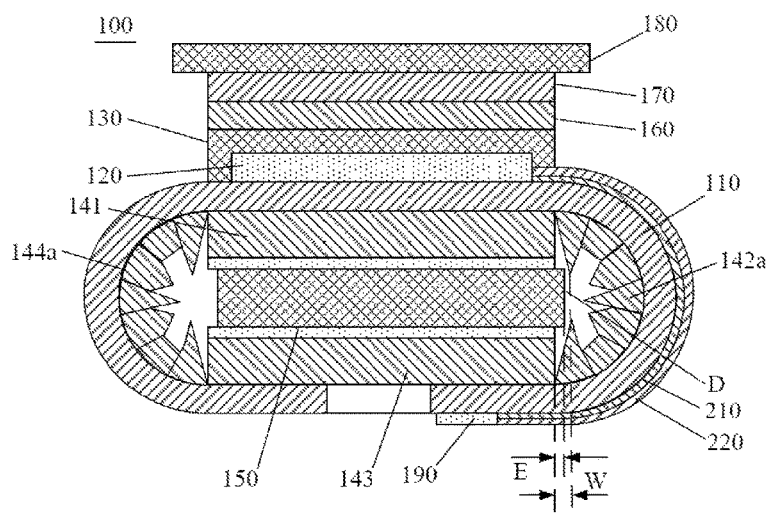
FIG. 25 is a cross-sectional view along A-A direction of the flexible display panel shown in FIG. 24.

In another embodiment, as shown in FIG. 24 and FIG. 25, FIG. 24 is a schematic structural diagram of a flexible display panel in a bending state in still another embodiment, FIG. 25 is a cross-sectional view along A-A direction of the flexible display panel shown in FIG. 24. In the flexible display panel, there are two positions where the flexible base layer 110 is bent, and the bending axes O of the two bending positions may be parallel to each other. Correspondingly, the supporting teeth 142a are disposed on both of the bending portions. The supporting teeth 142a are distributed at two opposing sides of the supporting body 150 along a direction where the above-mentioned width W is located (i.e., a direction parallel to the first area 141, from the supporting teeth 142a toward the supporting body 150, and perpendicular to the bending axis of the bending area 142), so as to further decrease the negative impact on the flexible base layer 110 due to the assembly error of the supporting body 150. Meanwhile, it should be noted that, the structures described in the above embodiments may also be applied to the structures shown in FIG. 24 and FIG. 25, which will not be further described herein.

Based on the above-mentioned flexible display panel 100, the embodiment of the present disclosure further provides a display apparatus that includes the flexible display panel 100 described in any one of the above embodiments.

The above are merely preferred embodiments of the present disclosure, which are not used to limit the present disclosure. For those skilled in the art, the present disclosure may have various modifications and changes. All the modifications, equivalent substitutions and improvements made within the spirit and principles of the present disclosure shall fall into the protection scope of the present disclosure.

What is claimed is:

1. A flexible display panel, comprising:
   a flexible base layer;
   a display device disposed on the flexible base layer;
   a packaging layer which packages the display device, the display device being located between the flexible base layer and the packaging layer;
   a supporting layer disposed at a side of the flexible base layer facing away from the display device, the supporting layer comprising a first area, a bending area and a second area, the first area being connected with the second area via the bending area, and the bending area comprising at least two supporting teeth; and
   a supporting body disposed in the first area or in the second area, the supporting body being located at the side of the flexible base layer facing away from the display device;
   wherein, when the bending area is in a flattening state, reserved space is formed between any adjacent two supporting teeth of the at least two supporting teeth;
   when the bending area is in a bending state, the flexible base layer, the first area, the supporting body, and the second area are sequentially stacked in a direction perpendicular to the first area, any adjacent two supporting teeth of the at least two supporting teeth contact with each other so as to provide a supporting force to the flexible base layer, the at least two supporting teeth together with the first area and the second area form an avoiding space; in a direction perpendicular to the first area, a projection of the avoiding space is within a projection of the bending area.

2. The flexible display panel according to claim 1, further comprising: a control chip, an orthographic projection of the control chip to the supporting layer being located within the second area; and a plurality of first leading wires, an orthographic projection of each of the first leading wires to the supporting layer being located within the bending area, wherein an orthographic projection of the display device to the supporting layer is located within the first area; and the display device is electrically connected with the control chip via the first leading wires.

3. The flexible display panel according to claim 1, wherein
   in the bending state:
   in the direction perpendicular to the first area, a width of the projection of the avoiding space is greater than or equal to an assembly error of the supporting body with respect to the supporting layer; and
   the width and the assembly error are both in a direction parallel to the first area, from the at least two supporting teeth toward the supporting body, and perpendicular to a bending axis of the bending area.

4. The flexible display panel according to claim 1, wherein
   the at least two supporting teeth comprise a first supporting tooth and a second supporting tooth, wherein in the flattening state, and in a direction from the first area toward the second area, the first supporting tooth is closer to the first area than supporting teeth except the first supporting tooth, and the second supporting tooth is closer to the second area than supporting teeth except the second supporting tooth, and
   in the bending state, at least one of the first supporting tooth and the second supporting tooth does not contact with the supporting body.

5. The flexible display panel according to claim 4, wherein
   the supporting layer further comprises at least one adhesive layer, in the bending state, the first area and the second area are respectively adhered to two opposing sides of the supporting body via the at least one adhesive layer;
   in the flattening state, a height of at least one of the first supporting tooth and the second supporting tooth is less than or equal to a total thickness of the first area and the adhesive layer; and
   a direction in which the height is located is a thickness direction of the first area.

6. The flexible display panel according to claim 4, wherein
   the supporting layer further comprises at least one adhesive layer, in the bending state, the first area and the second area are respectively adhered to two opposing sides of the supporting body via the at least one adhesive layer;
   in the flattening state, a height of at least one of the first supporting tooth and the second supporting tooth is less than or equal to a thickness of the first area; and
   a direction in which the height is located is a thickness direction of the first area.

7. The flexible display panel according to claim 1, wherein
   two or more of the at least two supporting teeth are a first supporting tooth and a second supporting tooth, respectively, and all of the at least two supporting teeth except the first and second supporting teeth each are an intermediate supporting tooth, in the flattening state, and in a direction from the first area toward the second area, the first supporting tooth is closer to the first area than the supporting teeth except the first supporting tooth, and the second supporting tooth is closer to the second area than the supporting teeth except the second supporting tooth; and in the flattening state, a height of the intermediate supporting tooth is greater than a height of the first supporting tooth and a height of the second supporting tooth;

a direction in which the height is located is a thickness direction of the first area.

8. The flexible display panel according to claim 7, wherein more than one intermediate supporting tooth is provided, and all of the intermediate supporting teeth have the same height.

9. The flexible display panel according to claim 7, wherein more than one first supporting tooth is provided, and all of the first supporting teeth have the same height, and/or more than one second supporting teeth are provided, and all of the second supporting teeth have the same height.

10. The flexible display panel according to claim 1, wherein the supporting layer further comprises a connection layer, and each of the at least two supporting teeth is connected with the flexible base layer via the connection layer.

11. The flexible display panel according to claim 10, wherein a thickness of the connection layer is less than a thickness of the first area.

12. The flexible display panel according to claim 1, wherein one end of each of the at least two supporting teeth is a connection end and the other end thereof is a free end, the connection end is connected with the flexible base layer, and a preset interval is provided between the free ends of adjacent two of the supporting teeth;

the connection ends of adjacent two of the supporting teeth contact with each other, or a second preset interval is provided between the connection ends of adjacent two of the supporting teeth.

13. The flexible display panel according to claim 1, wherein the at least two supporting teeth each comprise a first lateral surface and a second lateral surface;

in the flattening state, as for adjacent two of the supporting teeth, the first lateral surface of one of the two adjacent supporting teeth faces the second lateral surface of the other one of the two adjacent supporting teeth;

in the bending state, as for adjacent two of the supporting teeth, the first lateral surface of one of the two adjacent supporting teeth is in surface contact with the second lateral surface of the other one of the two adjacent supporting teeth.

14. The flexible display panel according to claim 13, wherein the supporting teeth each further comprises a top surface, wherein the first lateral surface, the top surface, and the second lateral surface are sequentially connected to one another, a non-zero angle is formed between the top surface and the first lateral surface, and another non-zero angle is formed between the top surface and the second lateral surface;

in the flattening state, as for adjacent two of the supporting teeth, the first lateral surface of one of the two adjacent supporting teeth faces the second lateral surface of the other one of the two adjacent supporting teeth; and the supporting teeth each comprises a connection surface for connecting with the flexible base layer, and the top surface faces the connection surface.

15. The flexible display panel according to claim 14, wherein the top surface is a flat surface, and in the flattening state, the top surface is parallel to the flexible base layer.

16. The flexible display panel according to claim 13, wherein at least one of the first lateral surface and the second lateral surface comprises at least two flat surfaces that are sequentially connected to one another, and a non-zero included angle is formed between the flat surfaces.

17. The flexible display panel according to claim 1, wherein each of the at least two supporting teeth is formed as a rib-like structure, and an extending direction of the supporting tooth is parallel to a bending axis of the bending area.

18. The flexible display panel according to claim 1, wherein

Two or more of the at least two supporting teeth are respectively a first supporting tooth and a second supporting tooth, in the flattening state, the first supporting tooth is closer to the first area than the supporting teeth except the first supporting tooth, and the second supporting tooth is closer to the second area than the supporting teeth except the second supporting tooth;

the supporting teeth each comprises a first lateral surface and a second lateral surface;

the first lateral surface of the first supporting tooth is closer to the first area than the second lateral surface of the first supporting tooth, and the second lateral surface of the second supporting tooth is closer to the second area than the first lateral surface of the second supporting tooth, the first lateral surface of the first supporting tooth is fitted with a lateral surface of the first area, and/or the second lateral surface of the second supporting tooth is fitted with a lateral surface of the second area.

19. The flexible display panel according to claim 15, wherein the supporting teeth are separated from each other, and each of the supporting teeth has a hexagonal longitudinal cross-section, and the adjacent supporting teeth are in surface contact with each other, the longitudinal cross-section is a surface perpendicular to a bending axis of the bending area.

20. The flexible display panel of claim 19, wherein two or more of the at least two supporting teeth are a first supporting tooth and a second supporting tooth, respectively, and all of the supporting teeth except the first and second supporting teeth are at least one intermediate supporting tooth, in the flattening state, and in a direction from the first area toward the second area, the first supporting tooth is closer to the first area than the supporting teeth except the first supporting tooth, and the second supporting tooth is closer to the second area than the supporting teeth except the second supporting tooth; and in the flattening state, a height of the intermediate supporting tooth is greater than a height of the first supporting tooth and a height of the second supporting tooth; a direction in which the height is located is a thickness direction of the first area;

the first lateral surface comprises a first surface and a second surface, the second lateral surface comprises a third surface and a fourth surface, the first surface is connected between the second surface and the connection surface, the third surface is connected between the fourth surface and the connection surface; in the bending state, the first surface of the first supporting tooth is fitted with a lateral surface of the first area, the fourth surface of the first supporting tooth is in surface contact with the first surface of the intermediate supporting tooth, as for adjacent two of the supporting teeth, the second surface of one of the two adjacent intermediate supporting teeth is in surface contact with the fourth surface of the other one of the two adjacent intermediate supporting teeth, the second surface of the second supporting tooth is fitted with a lateral surface of the second area, the second surface of the second supporting tooth is in surface contact with the third surface of the intermediate supporting tooth.

21. A display apparatus comprising a flexible display panel, wherein the flexible display panel comprises:

a flexible base layer;

a display device disposed on the flexible base layer;

a packaging layer which packages the display device, the display device being located between the flexible base layer and the packaging layer;

a supporting layer disposed at a side of the flexible base layer facing away from the display device, the supporting layer comprising a first area, a bending area and a second area, the first area being connected with the second area via the bending area, and the bending area comprising at least two supporting teeth; and a supporting body disposed in the first area or in the second area, the supporting body being located at the side of the flexible base layer facing away from the display device;

wherein, when the bending area is in a flattening state, reserved space is formed between any adjacent two supporting teeth of the at least two supporting teeth;

when the bending area is in a bending state, the flexible base layer, the first area, the supporting body, and the second area are sequentially stacked in a direction perpendicular to the first area, any adjacent two supporting teeth of the at least two supporting teeth contact with each other so as to provide a supporting force to the flexible base layer, the at least two supporting teeth together with the first area and the second area form an avoiding space; in a direction perpendicular to the first area, a projection of the avoiding space is within a projection of the bending area.

* * * * *